(12) United States Patent
Mori

(10) Patent No.: US 6,404,009 B1
(45) Date of Patent: Jun. 11, 2002

(54) SEMICONDUCTOR DEVICE AND METHOD OF PRODUCING THE SAME

(75) Inventor: Hideki Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/514,591

(22) Filed: Feb. 28, 2000

(30) Foreign Application Priority Data

Mar. 3, 1999 (JP) .......................................... 11-055770

(51) Int. Cl.$^7$ .............................................. H01L 29/76
(52) U.S. Cl. ...................... 257/335; 257/336; 257/339
(58) Field of Search ................... 257/335, 336, 257/339

(56) References Cited

U.S. PATENT DOCUMENTS

| | | | | |
|---|---|---|---|---|
| 4,300,150 A | * | 11/1981 | Colak ........................... | 257/336 |
| 4,939,566 A | * | 7/1990 | Singer et al. ................ | 257/343 |
| 5,237,193 A | * | 8/1993 | Williams et al. ............. | 257/336 |
| 6,207,994 B1 | * | 3/2001 | Rumennik et al. .......... | 257/342 |

FOREIGN PATENT DOCUMENTS

JP  3-57-211778  * 12/1982  ................. 257/339

OTHER PUBLICATIONS

W.S. Ruska, Microelectronic Processing, 1987, McGraw–Hill, p. 281.*

* cited by examiner

*Primary Examiner*—Eddie Lee
*Assistant Examiner*—George C. Eckert, II
(74) *Attorney, Agent, or Firm*—Sonnenschein, Nath & Rosenthal

(57) ABSTRACT

A semiconductor device, that is, transistor, of a high withstand voltage having a LOCOS offset drain, which can cause complete depletion of a drift region and achieve both of an improvement in the junction breakdown voltage and a decrease in the on-resistance, and a method of producing the same. A semiconductor device comprising at least a p-type substrate, an n-type epitaxial layer formed on it, a p-well formed in the surface layer of the n-type epitaxial layer, an n-type source region formed in the surface layer of the p-well, an n-type drain region formed next to the drain region via an element isolation layer (LOCOS), and a gate electrode formed on the n-type source region and the element isolation layer, in which device a p-type buried layer containing an impurity in a higher concentration than that of the p-type substrate is formed, except just below the n-type drain region, in a surrounding pattern around the n-type drain region, and a method of producing the same.

6 Claims, 8 Drawing Sheets

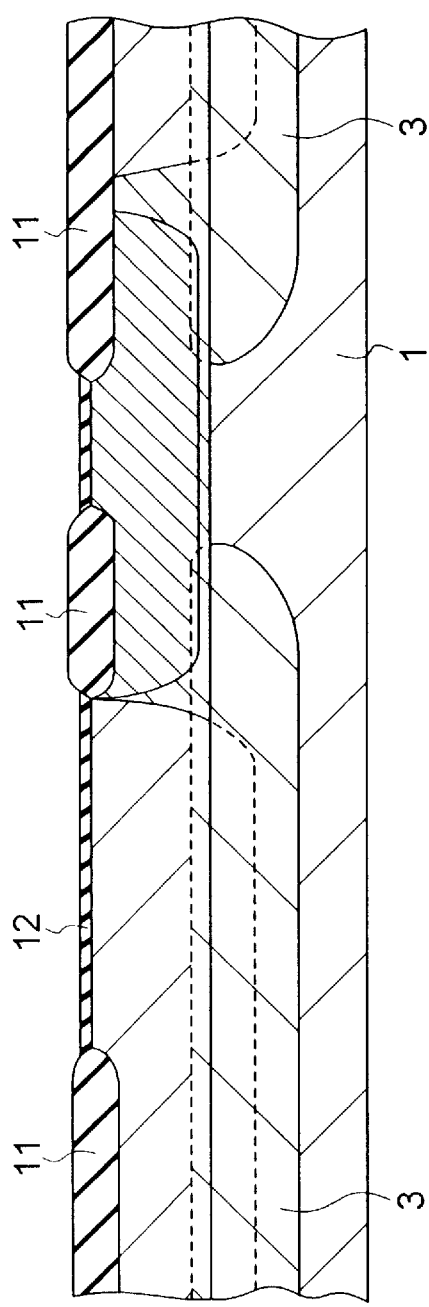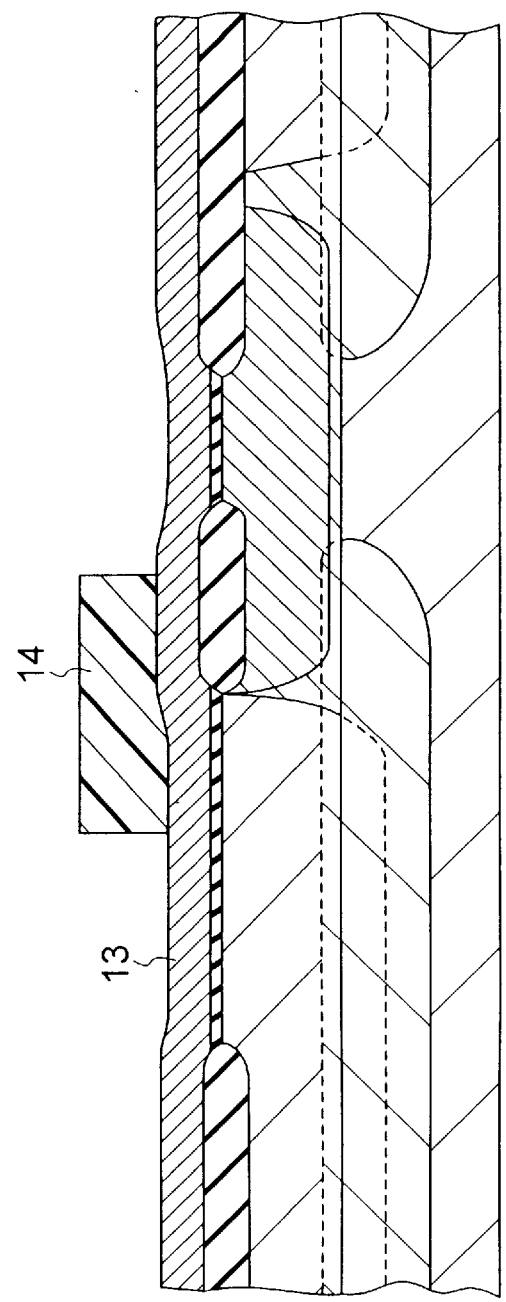
FIG. 5A
FIG. 5B

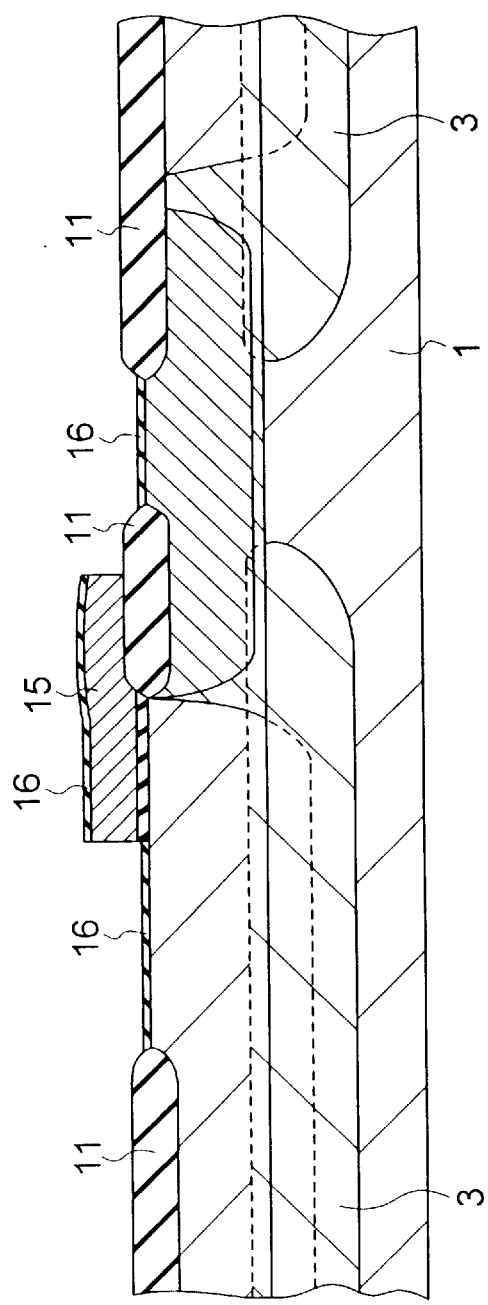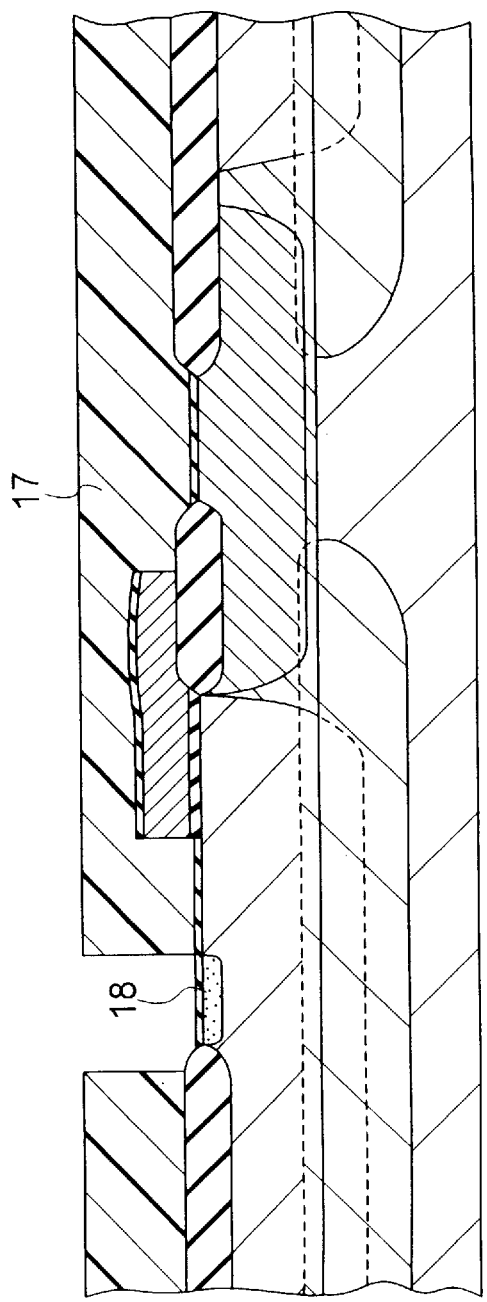
FIG. 6A
FIG. 6B

SEMICONDUCTOR DEVICE AND METHOD OF PRODUCING THE SAME

BACKGROUND OF THE INVENTION

1. Field of the Invention

The present invention relates to a semiconductor device of high withstand voltage having an offset drain and a method of producing the same, more particularly a MOS transistor of a high withstand voltage realizing both an improvement in the junction breakdown voltage and a decrease in on-resistance and a method of producing the same.

2. Description of the Related Art

In recent years, along with the spread of personal computers and the increase in size of televisions for home use, the market for displays has expanded rapidly. In the current market for displays, cathode ray tubes (CRTs) having a high definition, a high luminance, a wide viewing angle, and a high contrast are the most widespread. However, when a cathode ray tube is enlarged, the problem of an increase in the space occupied and the weight arises. Therefore, expectations have been rising for liquid crystal displays, plasma displays, and other flat panel displays capable of being made thinner and lighter as the next-generation displays.

In these flat panel displays, in the process of production of the electric field driving board controlling the intensity of the electric field for a pixel cell, it is necessary to form an electric field driving circuit having a high withstand voltage of several hundred V on a semiconductor substrate for controlling the plasma.

FIGS. 8A and 8B are cross-sectional views illustrating fundamental structures of conventional MOS transistors of high withstand voltages. The MOS transistors of high withstand voltages shown in FIG. 8 are called LOD (LOCOS offset drain)-type MOS transistors.

In an LOD-type MOS transistor, an n$^+$-type drain region 25 is formed away from a p-well 7 by a LOCOS oxide layer 11 for the purpose of securing a high junction breakdown voltage (BV$_{ds}$). On the other hand, an n$^+$-type source region 24 and a p$^+$-type p-well plug region (a p$^+$-type source region) 23 are short-circuited with a source electrode 27, thus a depletion layer extends from a junction of the p-well 7 and an n-type drift region 29 to the n-type drift region 29 when a reverse bias is supplied between the source and the drain. The withstand voltage of the transistor is secured by using the extension of the depletion layer to the n-type drift region 29 for preventing concentration of the electric field (easing the electric field).

In addition, in the transistor shown in FIG. 8, it is also intended to increase the withstand voltage by a RESURF (REduced SURface Field) technique, that is, easing of the electric field using an extension of a depletion layer at the junction of a p-type substrate 1 and an n-type epitaxial layer 4 in the surface direction.

Since a RESURF structure can be easily combined with pn junction separation and the withstand voltage can be controlled by adjusting the drift region length, this is advantageous as a structure of a transistor of a high withstand voltage.

In the above structure of conventional MOS transistors of high withstand voltages, the concentration of the impurity in the n-type drift region 29 is suppressed to a low level in order to gain the RESURF effect. By lowering the concentration of the impurity in the n-type drift region 29, it is intended that the depletion layer at the junction of the p-type substrate 1 and an n-type epitaxial layer 4 cause complete depletion of the n-type drift region 29.

However, in actually, when the depletion layer at the junction of the p-type substrate 1 and the n-type epitaxial layer 4 reaches the n$^+$-type drain region 25 containing an impurity in a high concentration, the extension of the depletion layer is prevented. Therefore, it was not possible to cause complete depletion to the surface of the n$^+$-type drift region 29 and it was difficult to improve the junction breakdown voltage.

Further, if the concentration of the impurity in the n-type drift region 29 is lowered, the depletion layer extending from the junction of the p-well 7 and the n-type drift region 29 to the n-type drift region 29 easily reaches the edge of the n$^+$-type drain region 25. If the depletion layer extending from the junction of the p-well 7 and the n-type drift region 29 to the n-type drift region 29 reaches the edge of the n$^+$-type drain region 25 with a lower voltage than the withstand voltage targeted for a MOS transistor, the extension of the depletion layer is stopped. Therefore, it becomes impossible to ease the electric field and the desired withstand voltage cannot be obtained.

To avoid this, it is necessary to increase the distance between the p-well 7 and the n$^+$-type drain region 25, that is, the drift region length shown in FIG. 8A as L. By increasing the drift region length L, it is possible to prevent the depletion region extending from the junction of the p-well 7 and the n-type drift region 29 to the n-type drift region 29 from reaching the edge of the n$^+$-type drain region 25.

On the other hand, when the drift region length L is increased, the problem of an increase of the resistance at the instant a transistor starts operating (on-resistance; R$_{on}$) also arises.

For example, in the case of a substrate with an n-type epitaxial layer 4 having a resistivity of 5 Ω·cm and a thickness of 5 μm and a p-type substrate having a resistivity of 10 Ω·cm, the drift region length L must be about 15 to 20 μm in order to set the breakdown voltage between the source and the drain (BV$_{ds}$) at 100 V. For further raising the breakdown voltage of the MOS transistor, a greater drift region length is required. If the drift region length L is increased, the cell size and the on-resistance (R$_{on}$) proportionally increase and obstruct the increase in integration degree and speed of the semiconductor device.

As shown in FIG. 8B, there is also a MOS transistor of a high withstand voltage reduced in the resistivity of the n$^+$-type drift region 29 by forming an n-type impurity diffusion layer 30 in the n$^+$-type drift region 29 for the purpose of decreasing the on-resistance (R$_{on}$) of the transistor. In the case of this structure, not only does the junction breakdown voltage between the p-well 7 and the n-type drift region 29 decrease, but also complete depletion of the surface of the n-type drift region 29 is made more difficult than the case of FIG. 8A. Therefore, the junction breakdown voltage (BV$_{ds}$) decreases.

As mentioned above, it has been difficult to achieve both an increase in the withstand voltage of a transistor and a decrease in the on-resistance.

SUMMARY OF THE INVENTION

The present invention was made in consideration of the above problems. Therefore, the present invention has as its object to provide a semiconductor device, that is, transistor, of a high withstand voltage having a LOCOS offset drain, which can cause complete depletion of the drift region and achieve both of an improvement in the junction breakdown voltage and a decrease in the on-resistance and a method of producing the same.

To achieve the above object, the semiconductor device of the present invention provides a semiconductor device comprising; a first conductivity type semiconductor substrate; a second conductivity type semiconductor layer formed on the first conductivity type semiconductor substrate; a first conductivity type impurity diffusion layer formed in a surface region of the second conductivity type semiconductor layer; a second conductivity type source region formed in a surface region of the first conductivity type impurity diffusion layer; a second conductivity type drain region formed in the surface region of the second conductivity type semiconductor layer at a predetermined distance from the first conductivity type impurity diffusion layer; an element isolating insulation layer formed between the second conductivity type source region and the second conductivity type drain region; a gate insulating film formed between the second conductivity type source region and the second conductivity type drain region; and a gate electrode formed on the gate insulating film, wherein a buried layer containing an impurity of the first conductivity type in a higher concentration than that of the first conductivity type semiconductor substrate is formed at least in part in the surface layer of the first conductivity type semiconductor substrate except just below the second conductivity type drain region.

The semiconductor device of the present invention is preferably characterized in that the buried layer is formed in a pattern surrounding the second conductivity type drain region except just below the second conductivity type drain region.

The semiconductor device of the present invention is preferably characterized in that a second conductivity type impurity diffusion layer is formed via a junction with the first conductivity type impurity diffusion layer in the surface layer of the second conductivity type semiconductor layer; and the second conductivity type drain region is formed in the surface layer of the second conductivity type impurity diffusion layer at a predetermined distance from the first conductivity type impurity diffusion layer.

The semiconductor device of the present invention is preferably characterized in that the gate electrode is composed of polycrystalline silicon.

The semiconductor device of the present invention is preferably characterized in that the first conductivity type is a p-type while the second conductivity type is an n-type.

The semiconductor device of the present invention is preferably characterized in that the second conductivity type semiconductor layer is an epitaxial layer.

The semiconductor device of the present invention is preferably characterized in that the gate insulating film is a silicon oxide film.

Further, to achieve the above object, the method of producing a semiconductor device of the present invention comprises the steps of: introducing a first conductivity type impurity into a surface layer of a first conductivity type semiconductor substrate to form a first conductivity type buried layer containing an impurity in a higher concentration than that of the first conductivity type semiconductor substrate; growing epitaxially a second conductivity type semiconductor layer on the first conductivity type semiconductor substrate; forming a first conductivity type impurity diffusion layer connected to the first conductivity type buried layer in the surface layer of the second conductivity type semiconductor layer; forming an element isolating insulation layer partly in the second conductivity type semiconductor layer; forming a second conductivity type source region in the surface layer of the first conductivity type impurity diffusion layer; forming a second conductivity type drain region in the surface layer of the second conductivity type semiconductor layer outside a region beneath which the first conductivity type buried layer is formed; forming a gate insulating film between the second conductivity type source region and the second conductivity type drain region and forming a gate electrode on the gate insulating film; and forming a source electrode and a drain electrode connected to the source region or the drain region respectively.

The method of producing a semiconductor device of the present invention is preferably characterized in that a step of forming a second conductivity type impurity diffusion layer comprises the second conductivity type drain region in the surface layer of the second conductivity semiconductor layer.

The method of producing a semiconductor device of the present invention is preferably characterized in that the gate electrode is composed of polycrystalline silicon.

The method of producing a semiconductor device of the present invention is preferably characterized in that the first conductivity type is a p-type while the second conductivity type is an n-type.

The method of producing a semiconductor device of the present invention is preferably characterized in that the gate insulating film is a silicon oxide film.

The method of producing a semiconductor device of the present invention is preferably characterized in that the element isolating insulation layer is formed between the second conductivity type source region and the second conductivity type drain region.

BRIEF DESCRIPTION OF THE DRAWINGS

These and other objects and features of the present invention will become clearer from the following description of the preferred embodiments given with reference to the accompanying drawings, in which:

FIGS. 5A and 5B are cross-sectional views of production steps of the method of producing a semiconductor device of the present invention;

FIGS. 6A and 6B are cross-sectional views of production steps of the method of producing a semiconductor device of the present invention;

DESCRIPTION OF THE PREFERRED EMBODIMENTS

Below, embodiments of the semiconductor device and the method of producing the same of the present invention will be explained with reference to the drawings.

Figure 1:
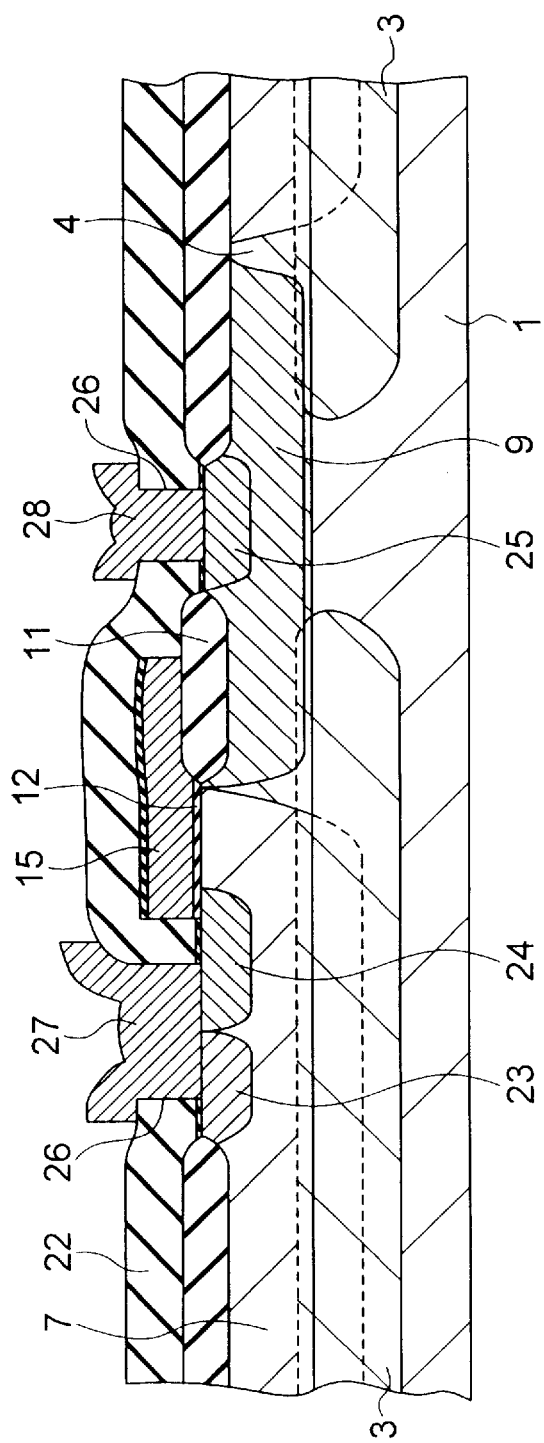
FIG. 1 is a cross-sectional view of a semiconductor device of the present invention.

FIG. 1 is a cross-sectional view of a semiconductor device of the present embodiment. The semiconductor device in FIG. 1 is a LOD (LOCOS offset drain) LD (lateral double-diffused) MOS transistor. A p-type buried layer is formed in a p-type substrate 1. The p-type buried layer 3 is not formed just below an n⁺-type drain region 25 but is formed in a pattern surrounding the n⁺-type drain region 25 in a top view. At the surface of the p-type substrate 1, an n-type epitaxial layer 4 is formed, an n⁺-type source region 24 is formed in a p-well 7 formed in the n-type epitaxial layer 4, and an n⁺-type drain region 25 is formed in an n-well 9 formed in the n-type epitaxial layer 4.

The p-well 7 and the n⁺-type drain region 25 are separated from each other by an element isolation layer 11. A gate electrode 15 composed of polycrystalline silicon is formed on the n-type epitaxial layer 4 via the element isolation layer 11 or a gate oxide 12. Above the n⁺-type source region 24 and the n⁺-type drain region 25, contact holes 26 are formed in an interlayer insulator 22. A source electrode 27 and a drain electrode 28 are formed in them respectively.

Next, an explanation will be made of a method of producing a semiconductor device of the above embodiment.

Figure 2A:
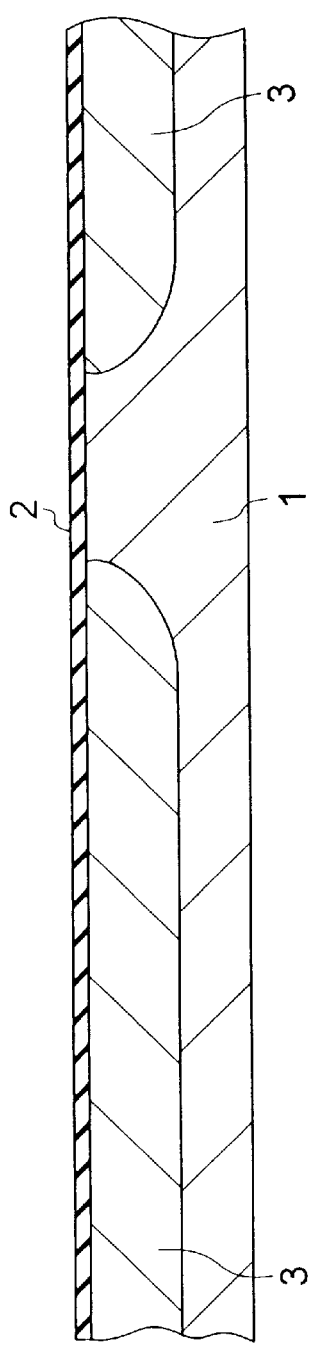
FIGS. 2A and 2B are cross-sectional views of production steps of the method of producing a semiconductor device of the present invention.

First, as shown in FIG. 2A, an oxide layer (a $SiO_2$ layer) 2 is formed at the surface of the p-type substrate 1 by steam-oxidation at about 900 to 1000° C. at a thickness of 60 to 100 nm. Next, a photoresist (not shown) having an opening at the p-type buried layer 3 forming region is formed on the $SiO_2$ layer 2 by the known photolithography and ions are implanted using the photoresist as a mask to introduce boron (B) of about $1×10^{13}$ to $1×10^{14}$ atoms/cm² in dosage.

Figure 8A:
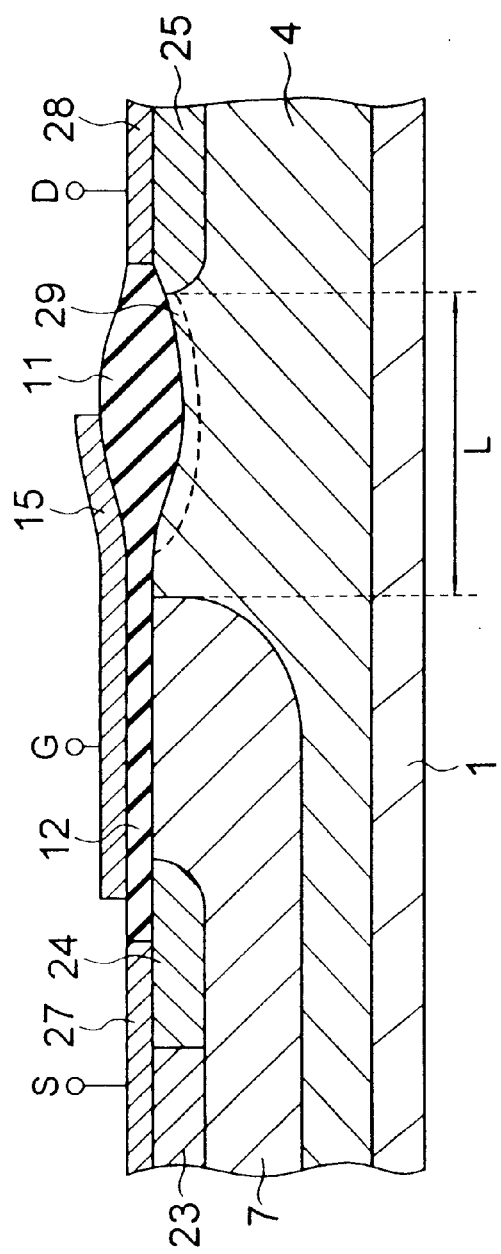
FIGS. 8A and 8B are cross-sectional views of conventional semiconductor devices.
Figure 8B:
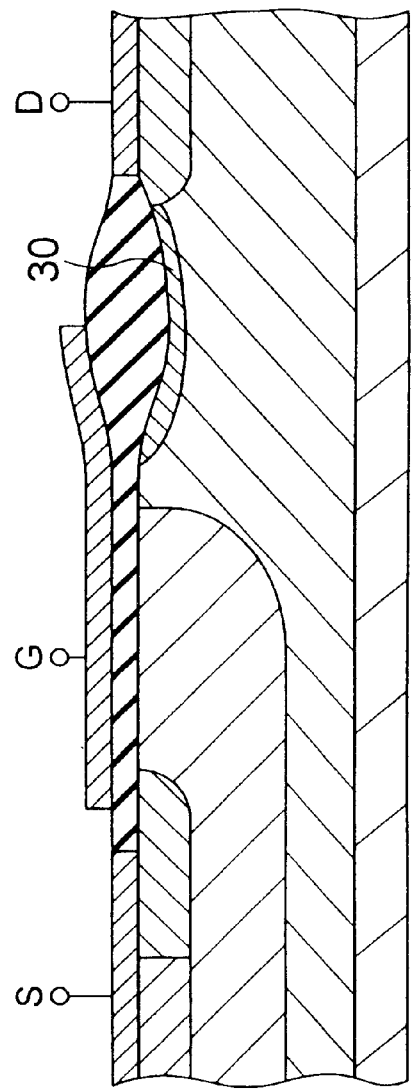

The p-type buried layer 3 is not formed just below the n⁺-type drain region 25 but is formed in a pattern surrounding the n⁺-type drain region 25 in a top view. Due to this, it is made possible to cause complete depletion of a drift region without increasing the drift region length (shown as L in FIG. 8) and to improve the breakdown voltage of the transistor without increasing the on-resistance.

After this, the photoresist is removed and boron is diffused by heat treatment at about 1100 to 1200° C. to form the p-type buried layer 3.

Figure 2B:
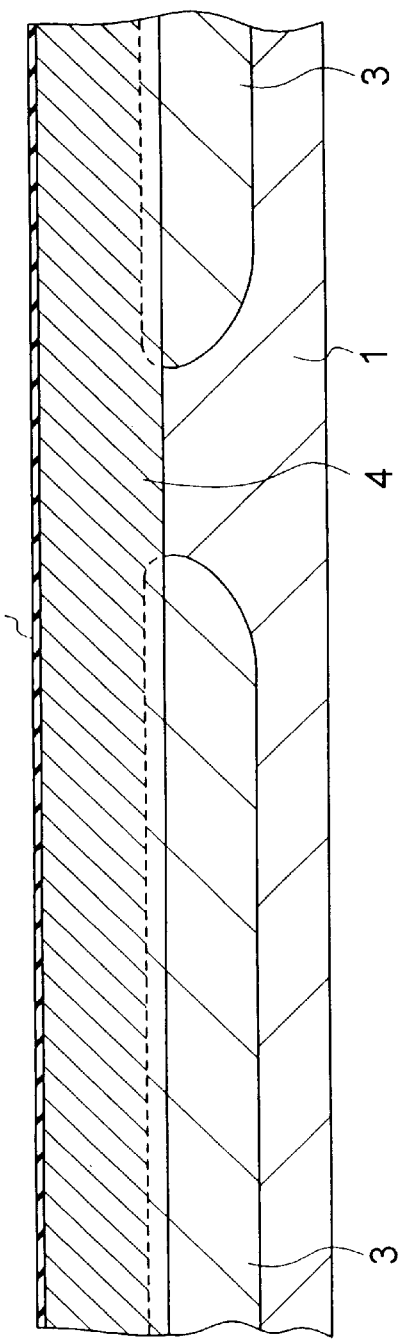

Next, as shown in FIG. 2B, the $SiO_2$ layer 2 on the p-type substrate 1 is removed using a hydrofluoric acid (HF) solution and then the n-type epitaxial layer 4 is formed on the p-type substrate 1 at a resistivity of about 5 to 10 Ω·cm. The thickness of the n-type epitaxial layer 4 is determined, in accordance with the desired breakdown voltage, by the general standard of about 10 μm per 100V. Next, a $SiO_2$ layer 5 is formed at the surface of the n-type epitaxial layer 4 by steam-oxidation at about 900 to 1000° C. to a thickness of 60 to 100 nm.

Figure 3A:
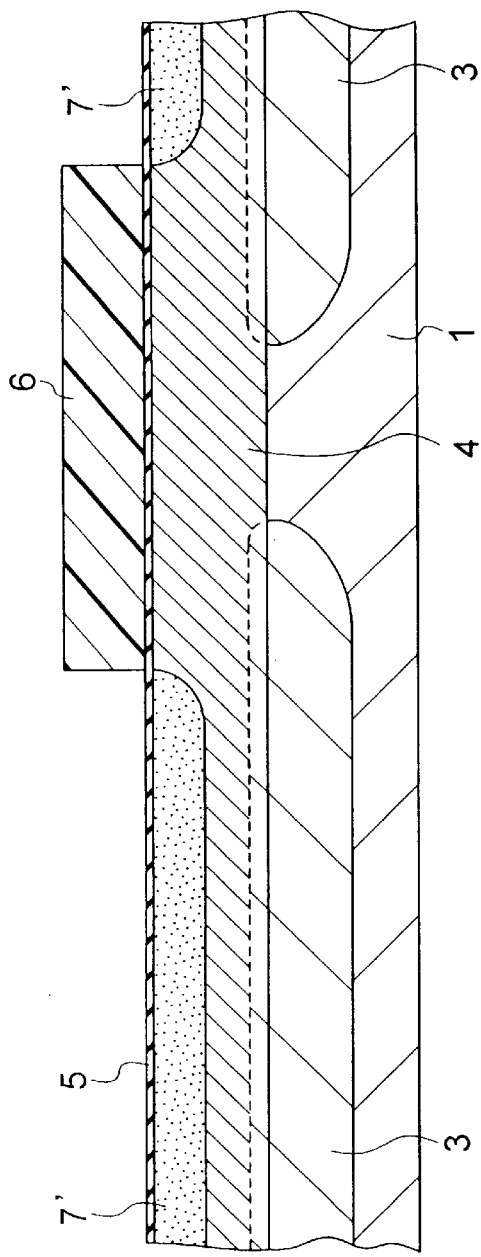
FIGS. 3A and 3B are cross-sectional views of production steps of the method of producing a semiconductor device of the present invention.

Next, as shown in FIG. 3A, a photoresist 6 having an opening at the active region of the MOS transistor is formed by the known photolithography technique. Using the photoresist 6 as a mask, a p-type impurity such as boron is ion-implanted into the active region of the MOS transistor (p-well forming region 7') at about $1×10^{12}$ to $1×10^{13}$ atoms/cm² in dosage. After this, the photoresist 6 is removed.

Figure 3B:
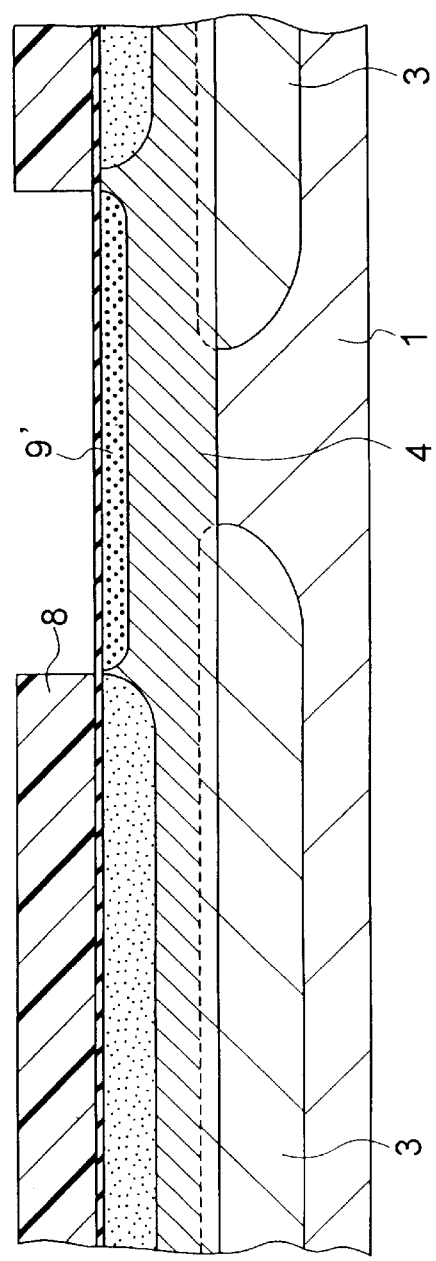

Next, as shown in FIG. 3B, a photoresist 8 having an opening at an n-type drift region of the MOS transistor is formed by the known photolithography technique. Using the photoresist 8 as a mask, an n-type impurity such as phosphorus is ion-implanted into an n-type drift region of the MOS transistor (n-well forming region 9') by about $5×10^{12}$ to $1×10^{13}$ atoms/cm² in dosage. After this, the photoresist 8 is removed.

Figure 4A:
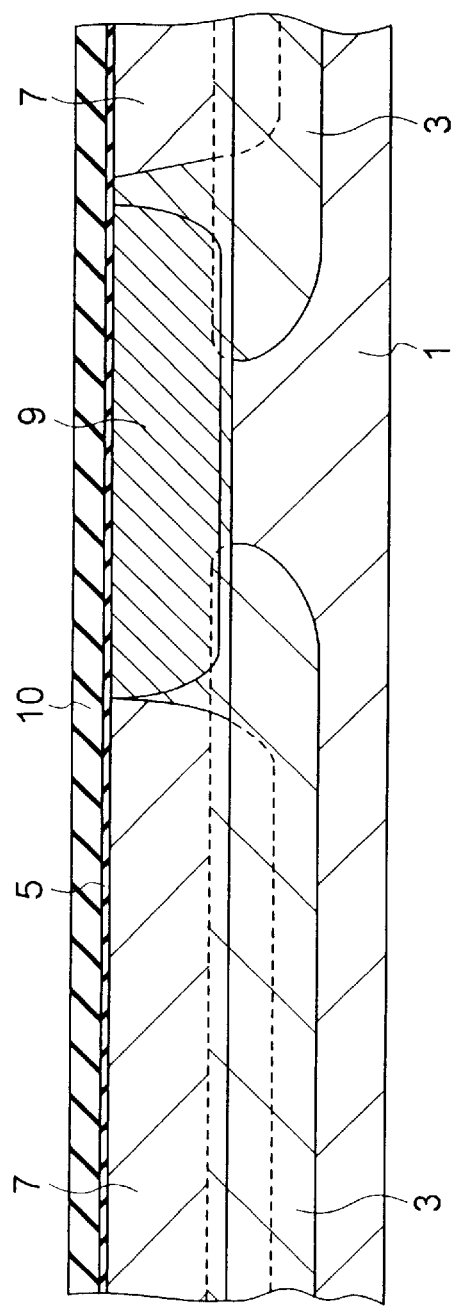
FIGS. 4A and 4B are cross-sectional views of production steps of the method of producing a semiconductor device of the present invention.

Next, as shown in FIG. 4A, a silicon nitride layer ($Si_3N_4$ layer) 10 is formed over the entire surface by a low-pressure CVD process, for example, to a thickness of about 80 to 100 nm. Next, the boron introduced in the active region and the phosphorus introduced in the n-type drift region are diffused by heat treatment (annealing) at about 1100 to 1200° C. to form the p-well 7 and the n-well 9 respectively.

Figure 4B:
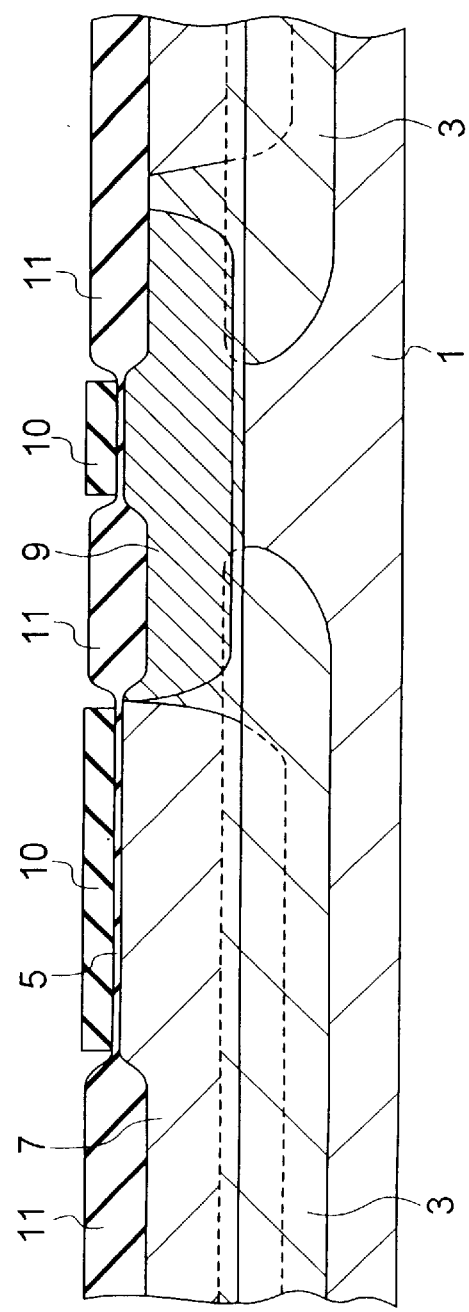

Next, as shown in FIG. 4B, to form the element isolation layer and separate the active regions, the $Si_3N_4$ layer 10 is left only on the active regions and the $Si_3N_4$ layer 10 in the other regions is removed by RIE (reactive ion etching), for example. Next, the LOCOS 11 composed of an oxide layer is formed by steam-oxidation at about 950 to 1000° C. to a thickness of about 500 to 700 nm. Next, the $Si_3N_4$ layer 10 is removed with hot phosphoric acid and the $SiO_2$ layer 5 at the surface of the n-type epitaxial layer 4 is removed using a hydrofluoric acid (HF) solution.

Next, as shown in FIG. 5A, the gate oxide 12 is formed at the surface of the n-type epitaxial layer 4 by steam-oxidation at 950 to 1000° C. to a thickness of about 20 to 50 nm.

Next, as shown in FIG. 5B, a polycrystalline silicon layer 13 is formed by the CVD process to a thickness of about 400 nm. After the polycrystalline silicon layer 13 is formed, an n-type impurity is introduced into the polycrystalline silicon 13 by ion-implantation or thermal diffusion from a PSG (phosphosilicate glass) layer (not shown) formed on the polycrystalline silicon layer 13. After this, a photoresist 14 having a pattern of the gate electrode is formed by the known photolithography on the polycrystalline silicon layer 13.

As shown in FIG. 6A, the polycrystalline silicon layer 13 and the gate oxide 12 are etched by the known etching process such as RIE using the photoresist 14 as a mask to form the gate electrode 15. After this, the photoresist 14 is removed. An oxide layer ($SiO_2$ layer) 16 is formed by steam-oxidation at 800 to 900° C. at the surface of the n-type epitaxial layer 4 except the region where the gate electrode 15 is formed and at the surface of the gate electrode 15 to a thickness of about 10 to 20 nm.

Next, as shown in FIG. 6B, a photoresist 17 is formed by the known photolithography and then about $1×10^{15}$ to $1×10^{16}$/cm² of boron (B) is ion-implanted into a p-well plug region. Due to this, a p⁺-type source impurity-implanted region 18 is formed. After this, the photoresist 17 is removed.

Figure 7A:
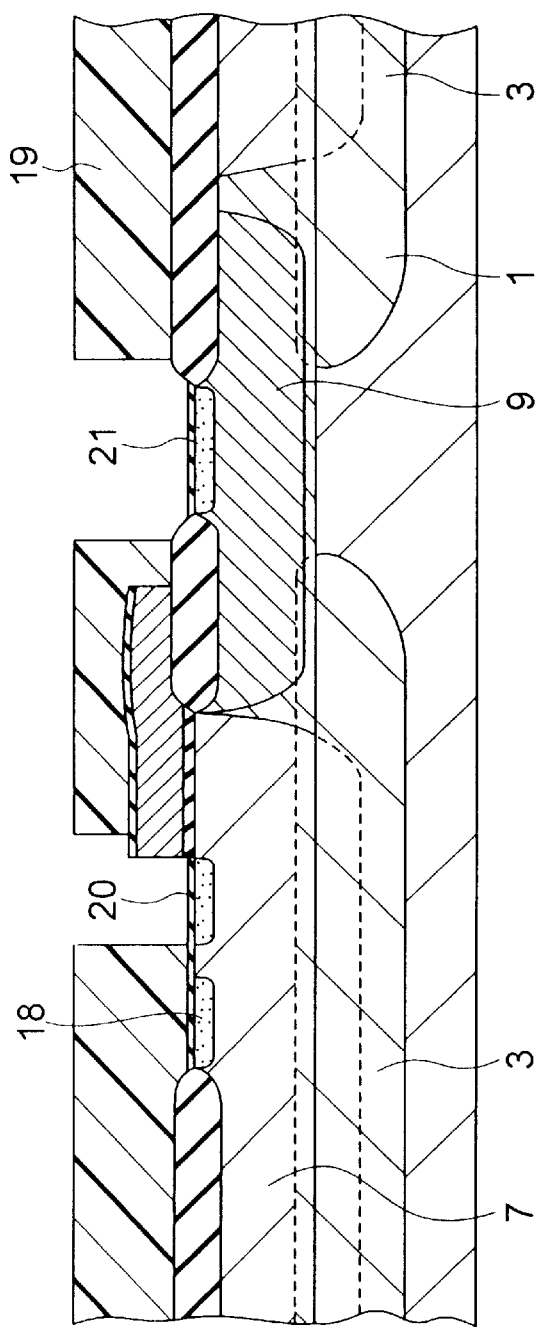
FIGS. 7A and 7B are cross-sectional views of production steps of the method of producing a semiconductor device of the present invention.

Next, as shown in FIG. 7A, a photoresist 19 having openings at an n⁺-type source forming region and at an n⁺-type drain forming region is formed by the known photolithography technique. Using the photoresist 19 as a mask, about $1×10^{15}$ to $1×10^{16}$/cm² of arsenic (As) is ion-implanted into the n⁺-type source forming region and the n⁺-type drain forming region. Due to this, an n⁺-type source impurity-implanted region 20 and an n⁺-type drain impurity-implanted region 21 are formed.

In this ion-implantation, the n⁺-type source region is formed by self-alignment using the gate electrode 15 as a mask. Therefore, it is possible to prevent any effect being felt by mask misalignment such as occurring when patterning a mask for ion-implantation by the photolithography process and therefore to perform the process precisely.

Figure 7B:
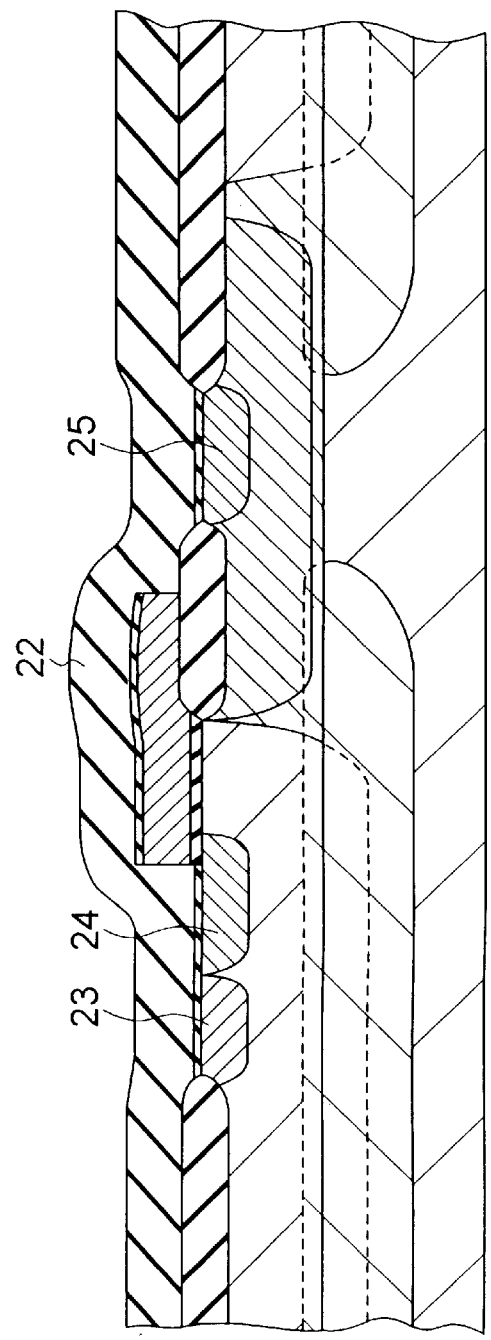

Next, as shown in FIG. 7B, the photoresist 19 is removed, then the interlayer insulator ($SiO_2$ layer) 22 is deposited over the entire surface by the CVD process to a thickness of about 600 nm. After this, heat treatment is performed at about 850 to 950° C. and both the boron in the p⁺-type source impurity-implanted region 18 and the arsenic in the n⁺-type source impurity-implanted region 20 and the n⁺-type drain impurity-implanted region 21 are diffused to form a p⁺-type source region (the p-well plug region) 23, the n⁺-type source region 24, and the n⁺-type drain region 25.

Next, a photoresist (not shown) is formed by the known photolithography process on the interlayer insulator 22, and RIE, for example, is performed using the photoresist as a mask. Due to this, as shown in FIG. 1, contact holes 26 connecting to the source region 23, 24, the drain region 25, or the gate electrode 15 are formed in the interlayer insulator 22.

After this, the photoresist is removed and a metal layer composed of Al or Al alloy and the like is vapor deposited in the contact holes 26 formed in the interlayer insulator 22. For the purpose of improving the bonding of an Al or Al alloy layer or preventing the reaction of Al and Si of the substrate caused by the diffusion of Al, a barrier metal layer composed of Ti/TiON/Ti etc. may be formed before the Al or Al alloy layer is formed. The metal layer is patterned by the known photolithography and RIE to form the source electrode 27 and the drain electrode 28.

Due to the process mentioned above, a semiconductor device having the structure as shown in FIG. 1 is obtained.

According to the above semiconductor device of the embodiment of the present invention, once the voltage is supplied, a depletion layer at the junction of the p-type buried layer 3 and the n-type epitaxial layer 4 reaches the surface of the drift region before a depletion layer at the junction of the p-type substrate 1 and the n-type epitaxial layer 4 reaches the n⁺-type drain region 25. Therefore, it is made possible to cause complete depletion of the drift region and to raise the breakdown voltage of a transistor. Also, according to the semiconductor device of the present embodiment, it is not necessary to increase the drift region length and it is possible to prevent an increase in the on-resistance.

According to the above method of production of the embodiment of the present invention, it is possible to form a buried layer, of the same conductivity type as a semiconductor substrate and having a higher concentration of impurity than the semiconductor substrate, in a surrounding pattern around the drain region except just below the drain region in a top view. Due to this, it is made possible to produce a semiconductor device improved in the junction breakdown voltage.

The semiconductor device and the method of producing the same of the present invention are not limited to the above embodiments. For example, it is possible to change the type of ion introduced in the p-well or the n-well if the impurity has a predetermined conductivity type.

In addition, various modifications may be made within a range not outside of the gist of the present invention.

According to the semiconductor device of the present invention, it is possible to cause complete depletion of the drift region without increasing the length of the second conductivity type impurity diffusion layer (the drift region length) and to achieve both of an improvement in the junction breakdown voltage and a decrease of the on-resistance.

According to the method of producing a semiconductor device of the present invention, it is possible to produce a semiconductor device capable of causing complete depletion of the drift region.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor device comprising:

a first conductivity type semiconductor substrate;

a second conductivity type semiconductor layer formed on the first conductivity type semiconductor substrate;

a first conductivity type impurity diffusion layer formed in a surface region of the second conductivity type semiconductor layer;

a second conductivity type source region formed in a surface region of the first conductivity type impurity diffusion layer;

a second conductivity type drain region formed in the surface region of the second conductivity type semiconductor layer at a predetermined distance from the first conductivity type impurity diffusion layer;

an element isolating insulation layer formed between the second conductivity type source region and the second conductivity type drain region;

a gate insulating film formed between the second conductivity type source region and the second conductivity type drain region; and a gate electrode formed on the gate insulating film, wherein a buried layer containing an impurity of the first conductivity type in a higher concentration than that of the first conductivity type semiconductor substrate is formed at least in part in a surface layer of the first conductivity type semiconductor substrate except just below the second conductivity type drain region;

a semiconductor device wherein the buried layer is formed in a pattern surrounding the second conductivity type drain region except just below the second conductivity type drain region.

2. A semiconductor device as set forth in claim 1, wherein:

further provision is made of a second conductivity type impurity diffusion layer formed via a junction with the first conductivity type impurity diffusion layer in the surface layer of the second conductivity type semiconductor layer; and the second conductivity type drain region is formed in the surface layer of the second conductivity type impurity diffusion region at a predetermined distance from the first conductivity type impurity diffusion layer.

3. A semiconductor device as set forth in claim 1, wherein the gate electrode is composed of polycrystalline silicon.

4. A semiconductor device as set forth in claim 1, wherein the first conductivity type is a p-type while the second conductivity type is an n-type.

5. A semiconductor device as set forth in claim 1, wherein the second conductivity type semiconductor layer is an epitaxial layer.

6. A semiconductor device as set forth in claim 1, wherein the gate insulating film is a silicon oxide film.

* * * * *